United States Patent [19]

Hatada

[11] Patent Number: 4,784,972

[45] Date of Patent: Nov. 15, 1988

[54] METHOD OF JOINING BEAM LEADS WITH PROJECTIONS TO DEVICE ELECTRODES

[75] Inventor: Kenzo Hatada, Katano, Japan

[73] Assignee: Matsushita Electric Industrial Co. Ltd., Osaka, Japan

[21] Appl. No.: 40,769

[22] Filed: Apr. 17, 1987

Related U.S. Application Data

[63] Continuation of Ser. No. 763,787, Aug. 8, 1985, abandoned.

[30] Foreign Application Priority Data

Aug. 18, 1984 [JP] Japan ................. 59-171937

[51] Int. Cl.[4] .................. H01L 21/60; H01L 21/603
[52] U.S. Cl. ....................................... 437/182; 437/183; 437/209; 228/180.2; 357/69
[58] Field of Search ............... 437/182, 183, 180, 209; 228/180.2, 188; 156/150, 151; 357/69

[56] References Cited

U.S. PATENT DOCUMENTS

| | | | |
|---|---|---|---|
| 3,599,056 | 8/1971 | Clark | 357/69 |
| 3,621,564 | 11/1971 | Tanaka et al. | 29/590 |
| 3,634,930 | 1/1972 | Cranston | 228/104 |
| 3,760,238 | 9/1973 | Hamer et al. | 317/234 R |
| 3,859,723 | 1/1975 | Hamer et al. | 29/626 |
| 3,971,428 | 7/1976 | Hall | 164/46 |
| 4,022,641 | 5/1977 | Lindberg | 156/650 |
| 4,052,787 | 10/1977 | Shaheen et al. | 29/626 |
| 4,096,348 | 6/1978 | Robillard et al. | 174/52 FP |
| 4,179,802 | 12/1979 | Joshi et al. | 29/628 |
| 4,312,117 | 1/1982 | Robillard et al. | 29/589 |
| 4,494,688 | 1/1985 | Hatada et al. | 228/180 A |
| 4,530,152 | 7/1985 | Roche et al. | 29/588 |
| 4,552,832 | 11/1985 | Blume et al. | 430/320 |
| 4,693,770 | 9/1987 | Hatada | 156/151 |

FOREIGN PATENT DOCUMENTS

| | | |
|---|---|---|
| 0061863 | 6/1982 | European Pat. Off. . |
| 54-4074 | 3/1979 | Japan . |
| 00008833 | 1/1981 | Japan . |
| 0037499 | 3/1981 | Japan . |
| 0119792 | 9/1981 | Japan . |

OTHER PUBLICATIONS

Seto, J. Y. W., Journal of Applied Physics, vol. 46, No. 121, Dec. 1975, pp. 5247–5248.

Harper, C. A., Handbook of Electronic Packaging, McGraw Hill, 1969, pp. 938–941.

Primary Examiner—Brian E. Hearn
Assistant Examiner—T. N. Quach
Attorney, Agent, or Firm—Wenderoth, Lind & Ponack

[57] ABSTRACT

Disclosed is a method for making beam leads with projections and for joining such beam leads to electrodes of a semiconductor device. On a substrate (10), beam leads (12) with projections (12A) are concurrently formed using a single process. Semiconductor device (16) is pressed to beam lead (2) to join electrode (14) to projection (12A). When the semiconductor device is lifted, beam leads which are joined into the device are removed from the substrate. The concurrent formation of the beam leads (12) and projections (12A) can be carried out by plating using a substrate (10) having either a projection (10A) or a region (24A) of different resistance.

10 Claims, 2 Drawing Sheets

METHOD OF JOINING BEAM LEADS WITH PROJECTIONS TO DEVICE ELECTRODES

This application is a continuation of now abandoned application Ser. No. 763,787, filed Aug. 8, 1985.

BACKGROUND OF THE INVENTION

This invention relates to a method of manufacturing a semiconductor device, and more particularly to a method of joining beam leads to electrodes of a semiconductor device.

Recently, semiconductor devices such as IC's and LSI's have been intensively introduced into the fields of various electric household appliances and industrial machinery. To some resources, same electricity or expand the range of application, such electric household appliances and industrial machinery have been gradually downsized or made portable.

To meet this downsizing trend, in the field of semiconductors, packages are required to be smaller and thinner. A silicon slice after a diffusion process and an electrode wiring process is cut into chips each in the unit of a semiconductor device, electrode leads are taken out from the aluminum electrode terminals disposed around each chip to external terminals for ease of handling, and chips are packaged for mechanical protection. Usually, for packaging of these semiconductor devices, Dual-in-Line (DIL) chip carrier, flip chip, and tape carrier methods are employed.

Of these methods, those which are high in reliability at the connecting portions and can present small and thin packages include the flip chip and tape carrier method. In the flip chip methods, a multilayer metal film called barrier metal is provided on electrode terminals on a semiconductor element, and metal bumps are provided on this multilayer metal film by an electroplating method.

On the other hand, in the case of the film carrier method, like in the flip chip method, metal bumps are provided through barrier metal on electrodes on a semiconductor device by the electroplating method. Metal leads are provided on a long polyimide tape with a specific width, and metal bumps on electrodes of a semiconductor element and metal leads are simultaneously connected at the same time, regardless of the number of electrodes.

However, these flip chip and tape carrier methods have the following drawbacks.

The flip chip and tape carrier methods require, as processes for forming metal bumps on electrodes of a semiconductor device, a deposition process for forming multi-layer electrode film, a photo-lithography process for forming a mask for electroplating, a plating process for forming metal bumps by electroplating, and an etching process for removing the unnecessary multi-layer electrode film. These processes injure a semiconductor device and thereby, the yield rate is lowered and the cost for forming metal bumps is increased. Further in the case of the flip chip method, since metal bumps are directly connected to wiring patterns of a circuit board, heat expansion and mechanical distortion, once occurred, are not relaxed and thereby, injure connecting portion of the metal bumps, and the semiconductor device itself so that electrical inferiority often occurs. On the other hand, in case of the film carrier method, metal bumps, which are formed on electrode terminals of a semiconductor device, are connected to metal leads, and then, electrical measurement is conducted by use of the metal leads, and thereafter, the metal leads are cut in predetermined length to be connected to the wiring patterns of the circuit board. Therefore, the film carrier method solves problems of the flip chip method, i.e., heat expansion and mechanical distortion of a circuit board etc., and the heat expansion etc., are relaxed by the metal lead so that a high reliability of connection is obtained. However, the manufacturing cost of carrier film, i.e., polyimide tape, on which metal leads are formed is extremely expensive so that the use of the film carrier method cannot become popular.

SUMMARY OF THE INVENTION

It is, accordingly, a primary object of this invention to provide a method of manufacturing a semiconductor device which can solve the abovestated problems of conventional methods.

Another object of this invention is to provide a method of manufacturing a semiconductor device wherein connection inferiority due to expansion or distortion of a circuit does not occur and the yield rate of semiconductor devices is not lowered.

These and other objects are accomplished by a a method of manufacturing a semiconductor device which comprises a step of aligning a beam lead and an electrode of a semiconductor device, the beam lead being formed on a substrate, and a step of pressing the electrode of the semiconductor device to the beam lead on a substrate and of removing the beam lead from the substrate, whereby said beam lead is joined to said electrode of the semiconductor device.

In a specific embodiment, the beam lead has a projection which is formed at a position corresponding to the electrode of the semiconductor device. The substrate has a projection for forming the projection of the beam lead. The substrate has an electrically conductive layer thereon which has a low resistance portion and high resistance portion, the low resistance portion being used for forming the projection of the beam lead.

This invention also relates to a method of manufacturing a semiconductor device which comprises a step of forming beam leads by electro-plating opening patterns formed on a substrate which has the opening patterns at positions corresponding to electrodes of a semiconductor device, a step of aligning a beam lead and the electrode of the semiconductor device, a step of pressing the electrode of the semiconductor device to the beam lead on the substrate and of removing the beam lead from the substrate, the beam lead thereby being joined to said electrode of the semiconductor device, and a step of forming new beam leads by electro-plating the opening patterns of the substrate.

This invention provides various advantages, among which are as follows.

(1) Forming leads on electrodes of a semiconductor device is carried out in only one step. Therefore, equipment for forming leads on a semiconductor device is extremely simplified and, material cost and manufacturing cost are lowered.

(2) Since leads are extended outside of the 15 semiconductor device, electrical inspection of the semiconductor may be readily conducted after the leads are connected. Since an inferior semiconductor device is rejected before mounting to a circuit board because of a previous inspection, the yield rate and reliability are increased.

(3) Since the leads must extend outside of the semiconductor device, the leads are readily mounted on the circuit board as it is, and extra steps and equipment are not necessary, so that reliability is extremely increased and manufacturing cost is lowered.

(4) Since the substrate on which the leads are formed can be plated repeatedly, the cost for forming the leads is extremely lowered.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENTS

Figure 1A:
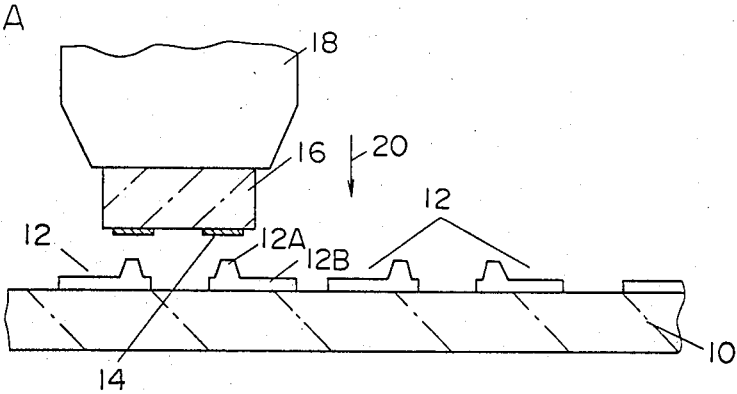
FIGS. 1A and 1B are sectional views showing one embodiment of the method of manufacturing a semiconductor device in accordance with this invention.

An embodiment of this invention is described with reference to FIG. 1. A substrate 10, on which beam leads 12 are formed, comprises an insulator made from ceramic, glass etc. as a main body. Each beam lead 12 has a projection 12A which can be located at a position opposite to an electrode 14 of semiconductor device 16, and has an extended base portion 12B. The beam leads 12 are formed on substrate 10 by a plating method or a printing method. The material of the beam lead is Au, solder, Cu, Ag etc., i.e., at least material which can be alloyed with electrode 14 of semiconductor device 16.

Figure 1B:
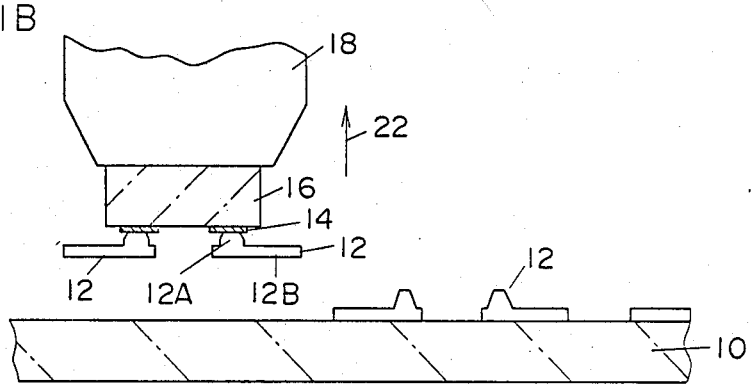

The semiconductor device 16 is held by tool 18 and alignment of electrode (e.g., Al) 14 of semiconductor device 16 and projection 12A of beam lead 12 is conducted by adjusting the position of tool 18. Then, tool 18 is lowered in the direction of arrow 20 (FIG. 1A), and, pressures and heats the semiconductor device 16 so that electrodes 14 of semiconductor device 16 are joined to projections 12A of beam leads 12 and beam leads 12 are removed from substrate 10 when tool 18 is lifted in the direction of arrow 22 (FIG. 1B). If beam lead 12 is made of Au, electrodes 14 of semiconductor device 16 are mechanically connected to beam leads 12 by Au.Al alloy which is formed at the respective connection portion of electrode 14 and beam lead 12. If beam lead 12 is made of Au and electrode 14 of semiconductor device 16 is made of Au, the mechanical connection of electrode 14 and beam lead 12 is realized by pressurization of Au and Au. The pressuring force of tool 18 is in the range 30–100 gram per beam lead, and the temperature is in the range 350°–550° C., and the pressuring time is of 1.5 second. These conditions assure a sure connection.

Figure 2:
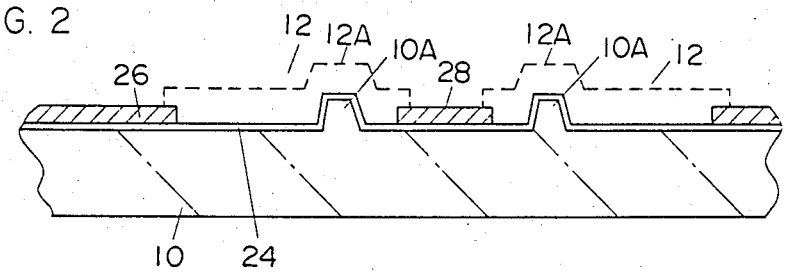
FIGS. 2 and 3 are sectional view showing a substrate on which beam leads are formed, in the method of the invention.

The structure of a substrate on which beam leads are formed is now explained. In the beam lead, the projection is formed for realizing complete connection with an electrode of a semiconductor device. Because of the presence of the projection, a compressive force is concentratively applied on an electrode of a semiconductor during a process of pressure and heat application by tool 18, so that an alloy is readily produced at the connection portions of the electrode and beam lead. In FIG. 2, projections 10A are formed on substrate 10 at positions corresponding to electrodes of a semiconductor, and an electrically conductive film 24 is formed on the entire surface of substrate 10. The conducting film 24 is made of Pt and Pd which can be plated and from which beam leads can be removed easily.

The masks 26, 28 for plating are of patterns which form beam leads 12, and made of a heat-resisting material such as $SiO_2$, $Si_3N_4$, $Al_2O_3$, polyimyde etc. If electro-plating is conducted with electrically conductive film 24 as one of electrodes for plating, beam leads are formed as shown in dotted line in FIG. 2. The projection 12A of beam lead 12 is formed by the presence of projection 10A of substrate 10.

After beam leads 12 are removed from substrate 10, substrate 10 is again subject to electro-plating so that new beam leads 12 are formed on substrate 10.

Figure 3:
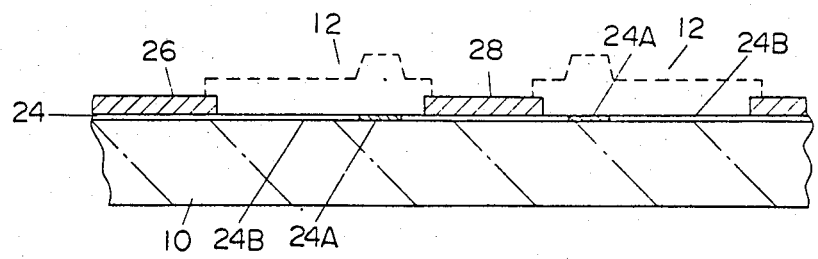

FIG. 3 shows another example of a substrate structure. The film 24 has two kinds of portions 24A, 24B which have different resistance. The portion 24A has low resistance and portion 24B has resistance higher than that of portion 24A. The portions 24A, 24B can be made of the same material with different resistance or can be made of different materials. The preparation of a film with different resistances formed from a same material is known from the fact the differential doping of a same material produces differences in resistivity. For example, Seto describes at page 5248 of the Journal of Applied Physics, Vol. 4, No. 12, December 1975, an abrupt decrease in resistivity with increasing doping of a polysilicon film by thermal decomposition of silane in argon. The masks 26, 28 for plating are formed on film 24. When electro-plating is conducted, the electric field is lowered at a position of high resistance in plating resolution so that the plating is formed thinner. On the contrary, the plating is formed thicker at a position of low resistance. Therefore, a thick layer is formed on portion 24A and a thin layer is formed on portion 24B, and beam lead 12 with projection 12A is obtained on substrate 10. Since the adhesion force is generally weak in area of high resistance, the beam leads are easy to be removed from substrate 10 when the beam leads are joined with electrodes of the semiconductor. Forming beam leads may be realized by a printing method instead of electro-plating.

Figure 4:
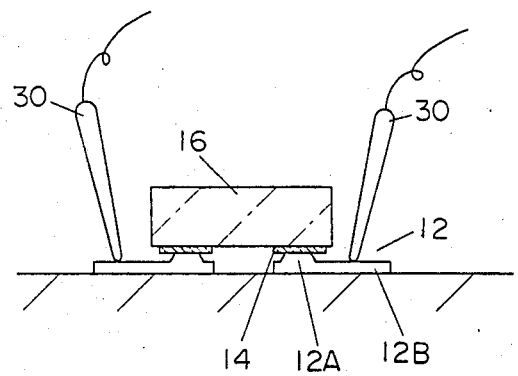
FIG. 4 shows a way of inspecting a semiconductor device with beam leads.

The step of mounting a semiconductor device on a circuit board is now explained. When beam leads 12 are joined to electrodes 14 of semiconductor device 16, the beam leads are extended outside of the semi-conductor device as shown in FIG. 4. Therefore, if probes 30 for use in taking characteristic measurement are joined to prolonged base portions 12B of beam leads, electrical inspection of the semiconductor device is readily carried out.

Figure 5:
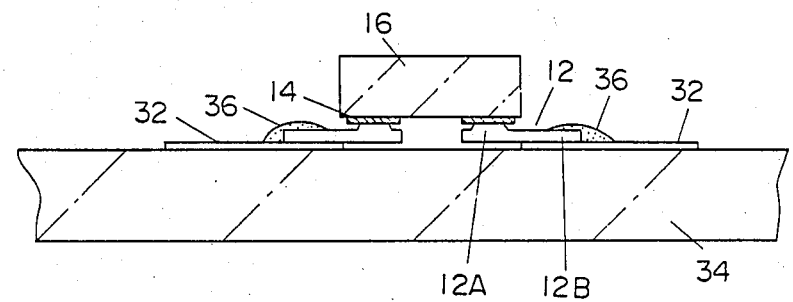
FIGS. 5 and 6 are sectional views of a semiconductor device with beam leads connected to a circuit board.
Figure 6:
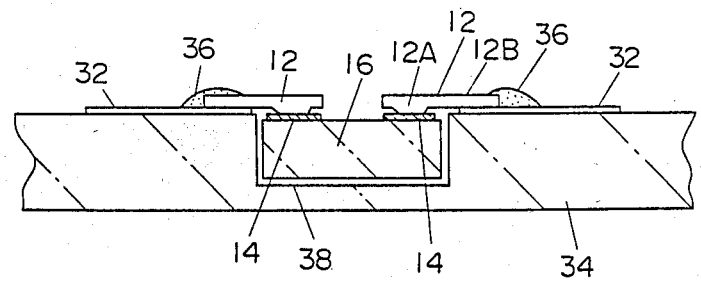

After completion of the inspection, semiconductor device 16 may be fixed on wiring patterns 32 of circuit board 34 by solder 36 face-down (FIG. 5), and may be fixed on patterns 32 by solder 36 after semiconductor device 16 is inserted into recess 38 of circuit board 34.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What is claimed is:

1. A method of manufacturing a semiconductor device which includes a semiconductor member having a semiconductor and an electrode, and a beam lead, comprising the steps of:
providing a substrate;
using a single process to concurrently form a lead portion and a projection of a beam lead on the substrate,
the projection extending from the lead portion, disposed on the substrate and projecting from the substrate;
aligning the projection of the beam lead with an electrode of a semiconductor member,
after said step of aligning, pressing the electrode against the projection so as to thereby join the electrode to the beam lead at the projection; and
after said step of pressing, moving the semiconductor member with the electrode thereof and the beam lead joined to the electrode away from the substrate so as to thereby separate the beam lead from the substrate.

2. A method as in claim 1, wherein said step of providing a substrate includes the single process consist of providing a substrate having a projection and the step of forming the beam lead over the projection of the substrate to form the projection of the beam lead on the projection of the substrate.

3. A method as in claim 1, wherein said step of providing a substrate includes the step of providing a substrate having an electrically conductive layer which includes a low resistance portion and a high resistance portion and the step of electro-plating the beam lead thereon so as to form the projection of the beam lead on the low resistance portion.

4. A method of manufacturing a semiconductor device which includes a semiconductor member having a semiconductor and electrodes, and beam leads, comprising the steps of:
electro-plating an open pattern of electrically conductive material forming a plurality of spaced beam leads having respective projections, onto a substrate with the projections being formed at locations on the substrate corresponding to the locations of electrodes of a semiconductor member;
after said step of electro-plating, positioning the semiconductor member so that the locations of the electrodes are aligned with the corresponding locations of the projections;
after said step of positioning, pressing the electrodes against the projections so as to thereby join the electrodes to the lead beams at the projections;
after said step of pressing, moving the semiconductor member with the electrodes thereof and the lead beams joined to the electrodes away from the substrate so as to thereby separate the beam leads from the substrate to provide a first semiconductor device; and
after said step of pressing, repeating said steps of electro-plating, positioning, pressing and moving using the same substrate, to provide a second semiconductor device.

5. A method as in claim 4, wherein said step of electro-plating includes the step of electro-plating the open pattern of electrically conductive material forming the plurality of spaced beam leads having respective beam lead projections, onto a substrate having substrate projections at locations of electrodes of a semiconductor member, so that the beam lead projections are formed on the substrate projections.

6. A method as in claim 4, wherein said step of electro-plating includes the step of providing a substrate having an electrically conductive layer which includes low resistance portions and high resistance portions and the step of electro-plating on the conductive layer so as to form the projections of the beam lead on the low resistance portions.

7. A method of manufacturing semiconductor devices which includes a semiconductor member having a semiconductor and electrodes, and a beam lead, comprising the steps of:
electro-plating electrically conductive material forming a plurality of spaced beam leads having respective projections, onto openings formed on a substrate, with the projections being formed at locations on the substrate corresponding to the locations of electrodes of a semiconductor member;
after said step of electro-plating, positioning the semiconductor member so that the locations of the electrodes are aligned with the corresponding locations of the projections;
after said step of positioning, pressing the electrodes against the projections so as to thereby join the electrodes to the beam leads at the projections;
after said step of pressing, moving the semiconductor member with the electrodes thereof and the beam leads joined to the electrodes away from the substrate so as to thereby separate the beam leads from the substrate to provide a first semiconductor device; and
after said step of pressing, repeating said steps of electro-plating, positioning, pressing and moving using the same substrate, to provide a second semiconductor device.

8. A method as in claim 7, wherein said step of electro-plating includes the step of electro-plating the electrically conductive material forming the plurality of spaced beam leads having respective beam lead projections, onto the substrate having substrate projections at locations on the substrate corresponding to the locations of electrodes of a semiconductor member, so that the beam lead projections are formed on the substrate projections.

9. A method as in claim 7, wherein said step of electro-plating includes the step of providing a substrate having an electrically conductive layer which includes low resistance portions and high resistance portions and the step of electro-plating on the conductive layer so as to form the projections of the beam leads on the low resistance portions.

10. A method of manufacturing a semiconductor device which includes a semiconductor member having a semiconductor and an electrode, and a beam lead, comprising the steps of:
providing a substrate;
using a single process to concurrently form a lead portion and a projection of a beam lead on the substrate,
the projection extending from the lead portion, disposed on the substrate and projecting from the substrate;
aligning the beam lead with an electrode of a semiconductor member;

after said step of aligning, pressing the electrode against the projection so as to thereby join the electrode to the beam lead; and after said step of pressing, moving the semiconductor member with the electrode thereof and the lead beam joined to the electrode away from the substrate so as to thereby separate the beam lead from the substrate.

* * * * *